Figure 1:
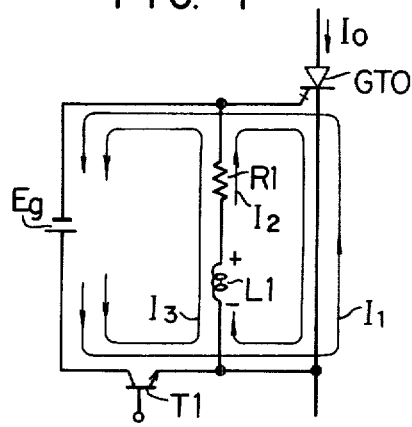

United States Patent [19]

Onda et al.

[11] 4,297,594
[45] Oct. 27, 1981

[54] GATE CIRCUIT FOR A GATE TURN-OFF THYRISTOR

[75] Inventors: Kenichi Onda, Hitachi; Sadaji Tashiro, Kumagaya; Hisao Amano, Hitachi, all of Japan

[73] Assignees: Hitachi, Ltd.; Hitachi Metals, Ltd., both of Tokyo, Japan

[21] Appl. No.: 50,522

[22] Filed: Jun. 21, 1979

[30] Foreign Application Priority Data

Sep. 27, 1978 [JP] Japan .................................. 53-119015

[51] Int. Cl.³ .......................................... H03K 17/72
[52] U.S. Cl. ............................ 307/252 C; 307/252 J
[58] Field of Search ........... 307/252 C, 252 J, 252 M, 307/305, 264, 268, 262

[56] References Cited

U.S. PATENT DOCUMENTS

| | | | |
|---|---|---|---|
| 3,348,073 | 10/1967 | Oudard | 307/252 C |
| 3,821,565 | 6/1974 | Horinaga | 307/252 C |
| 3,840,275 | 10/1974 | Takahashi | 307/252 C |
| 3,927,332 | 12/1975 | McKeon et al. | 307/252 C |

Primary Examiner—John Zazworsky
Attorney, Agent, or Firm—Craig and Antonelli

[57] ABSTRACT

A gate circuit for a gate turn-off (GTO) thyristor comprises current supply means for supplying a turn-off current to the GTO thyristor, and energy storing means for storing energy by receiving a current from the current supply means and supplying the stored energy to the GTO thyristor as the turn-on current therefor.

4 Claims, 7 Drawing Figures

GATE CIRCUIT FOR A GATE TURN-OFF THYRISTOR

The present invention relates in general to a gate circuit for a gate turn-off thyristor (GTO thyristor). More particularly, the invention concerns a gate circuit for a GTO thyristor having a single gate power supply source and consuming only extremely low power.

The gate turn-off thyristor or the GTO thyristor is turned on by a gate current supplied to its gate as in the case of a usual thyristor. However, the GTO thyristor differs from the usual thyristor in that the GTO thyristor is turned off by a backward gate current flowing out from its gate.

Conventionally, the hitherto known gate circuit for a GTO thyristor in which a single gate power source is used comprises a d.c. power supply source for supplying a turn-on current to the GTO thyristor and means for storing energy of d.c. current flowing from the d.c. power supply source upon turning-on of the GTO thyristor, so that the stored energy is utilized as a turn-off current for the GTO thyristor. When a capacitor, for example, is employed as the energy storing means in the hitherto known circuit of the arrangement described above, the voltage appearing across the capacitor is lowered upon turning off of the GTO thyristor, as the result of which it becomes impossible to maintain a sufficiently high backward bias voltage between the gate and the cathode of the GTO thyristor during the turn-off interval. Consequently, there arises a possibility that the GTO thyristor might be erroneously fired due to a voltage rise rate (dv/dt) in the terminal voltage of the GTO thyristor or the like factor. Such a conventional gate circuit for a GTO thyristor is, for example, disclosed in Japanese Patent Application Laid-Open No. 62974/78 (Tokyo Shibaura Electric Co., Ltd.), laid open on June 5, 1978.

On the other hand, when an inductor is employed as the energy storing means in the prior art gate circuit described above, a voltage induced by energy remaining in the inductor after the turn-off of the GTO thyristor will give rise to an avalanche between the gate and the cathode, if the induced voltage exceeds the reverse blocking voltage between the gate and the cathode of the GTO thyristor. The loss due to the avalanche becomes maximum when the GTO thyristor is operated in the absence of anode current, involving such a danger that the gate-cathode path would be broken down due to the loss produced by the avalanche particularly in the case of a high frequency operation. As an attempt to protect the GTO thyristor from such an undesirable phenomenon, it has been proposed to insert a series connection of a diode and a zener diode between the gate and the cathode of the GTO thyristor. However, then the energy remaining in the inductor will be consumed wastefully by the zener diode, and such loss is increased as the operation frequency becomes higher.

An object of the invention is to provide a gate circuit for a GTO thyristor in which loss of electrical energy is suppressed to a minimum.

Another object of the invention is to provide a gate circuit for a GTO thyristor which is excellently suited for preventing erroneous firing of the GTO thyristor.

Still another object of the invention is to provide a gate circuit for a GTO thyristor which allows turn-off operation of the GTO thyristor to be performed in a stable manner without giving rise to any avalanche between the gate and the cathode of the GTO thyristor.

Still another object of the invention is to provide a gate circuit for a GTO thyristor which is suited for the operation of the GTO thyristor at a high frequency.

Still a further object of the invention is to provide a gate circuit for a GTO thyristor which is capable of readily storing the turn-on electric energy for starting the GTO thyristor.

According to a general aspect of the invention, energy is stored from a d.c. power supply source destined to supply a turn-off current to the GTO thyristor and the stored energy is fed to turn-off the GTO thyristor, in contrast to the hitherto known gate circuit in which energy is stored from a d.c. power source supplying a turn-on current to the GTO thyristor and the stored energy is fed to turn off the GTO thyristor. The invention starts from the inventors' finding that the amplitude of the turn-on current for the GTO thyristor is in the order of 10% of that of the turn-off current. According to the teaching of the invention, since the gate-cathode path of the GTO thyristor is biased backwardly by a voltage from the d.c. gate power source during a turn-off time period, the GTO thyristor can be protected from any erroneous firing. Additionally, in the present invention, since the energy stored in energy storing means is such as to be fed to the gate-cathode path of the GTO thyristor constantly in the forward direction, there will not be produced any high backward voltage between the gate and the cathode of the GTO thyristor, which means that there is no possibility of the occurrence of an avalanche. In this manner, it is unnecessary to provide a series connection of a diode and a zener diode between the gate and the cathode of the GTO thyristor, involving substantially no increased loss of electric energy in the circuit even at high frequency operation.

According to another aspect of the invention, the means for storing the energy for turning on the GTO thyristor is constituted by an inductor or a transformer in place of a capacitor and is connected in parallel to the d.c. gate power source. This circuit configuration is advantageous in that energy used for turning on the GTO thyristor can be stored in the inductor or transformer without resorting to the use of an auxiliary circuit even when operation is to be started in the non-conducting state of the GTO thyristor.

According to the present invention, there is provided a gate circuit for a GTO thyristor comprising first means inserted between the cathode and the gate of said gate turn-off thyristor for supplying a turn-off current to said gate turn-off thyristor; and second means connected in parallel to said first means for storing energy by receiving current from said first means and for supplying the stored energy to said gate turn-off thyristor as a turn-on current therefor.

Figure 2:
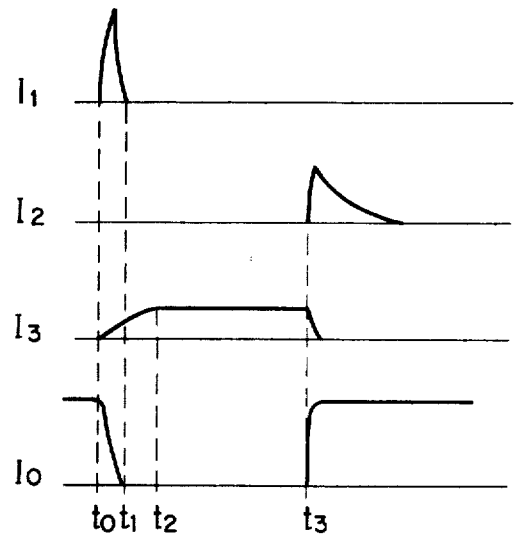
Figure 3:
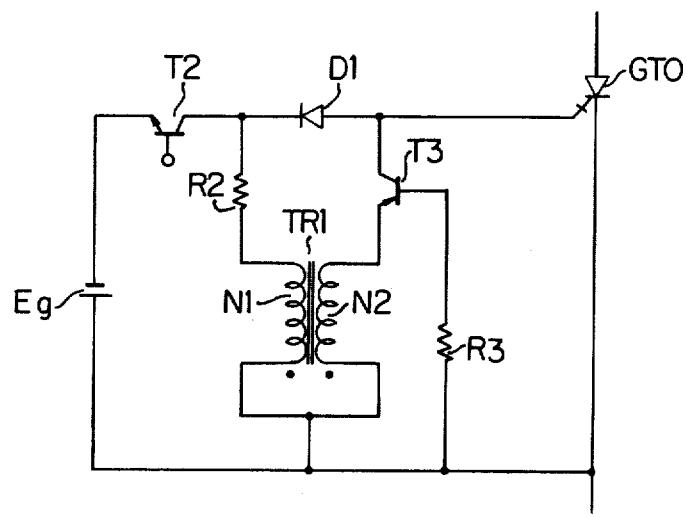
Figure 4:
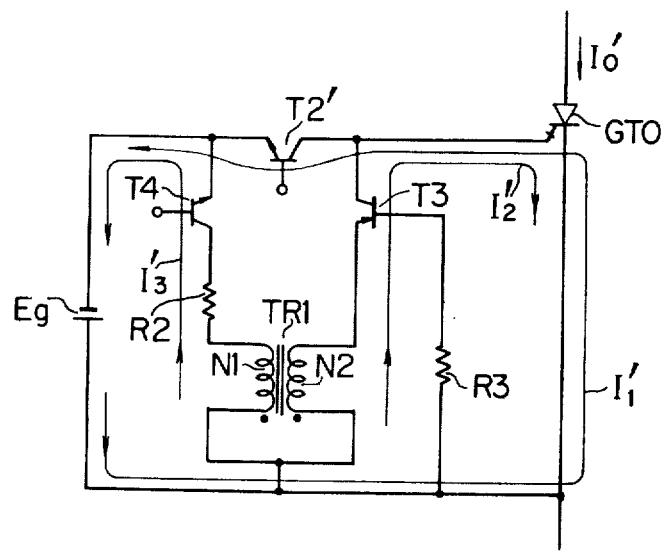
Figure 5:
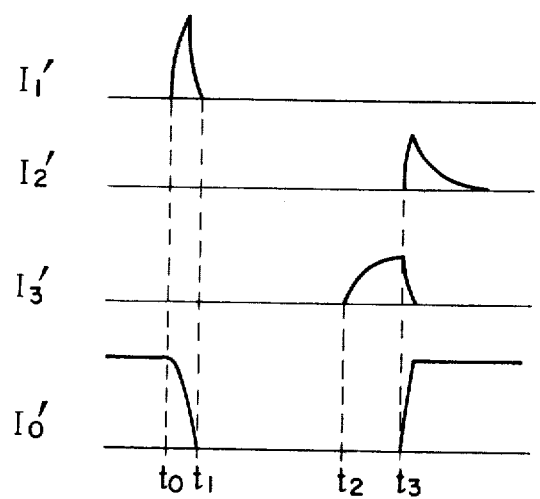
Figure 6:
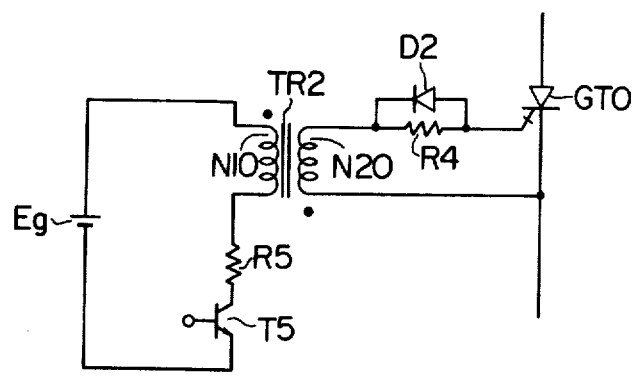
Figure 7:
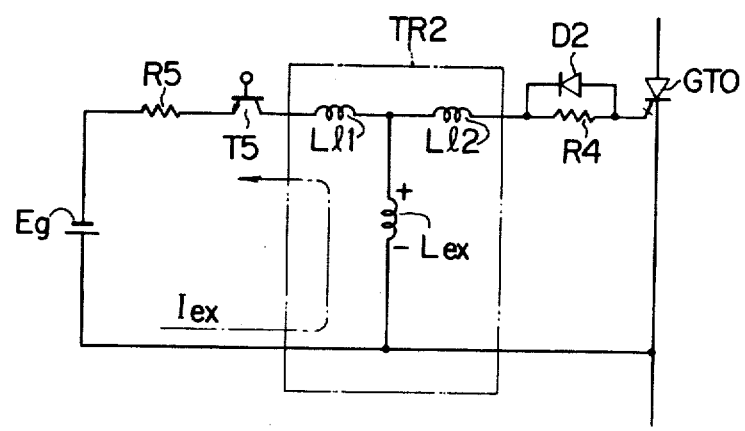

The invention will now be described by way of example with reference to the accompanying drawings, in which:

FIG. 1 is a circuit diagram of a gate circuit for a GTO thyristor in which an inductor is employed as energy storing means, according to one embodiment of the present invention;

FIG. 2 graphically illustrates waveforms of current flows at various circuit points shown in FIG. 1 as a function of time;

FIGS. 3, 4 and 6 are circuit diagrams of gate circuits for a GTO thyristor in each of which a transformer is employed as energy storing means, according to other embodiments of the present invention;

FIG. 5 graphically illustrates waveforms of current flows at various circuit points in the circuit shown in FIG. 4 as a function of time lapse; and FIG. 7 is a equivalent circuit of the circuit shown in FIG. 6.

FIG. 1 shows a gate circuit for a GTO thyristor in which an inductor is employed as the means for storing energy for turning on a GTO thyristor, according to one embodiment. As can be seen from the figure, a d.c. power source Eg is connected between the gate and the cathode of a GTO thyristor GTO. The positive pole of the d.c. power source Eg is connected to the cathode side of the thyristor GTO through a transistor T1, while the negative pole of the power source Eg is connected to the gate side of the thyristor GTO. Alternately, the transistor T1 may be inserted between the negative pole of the d.c. power source Eg and the gate of the thyristor GTO. A series connection of an inductor L1 and a resistor R1 is connected in parallel with the d.c. power source Eg. The inductance for the inductor L1 and the resistance for the resistor R1 are determined in dependence on the operating frequency of the thyristor. In FIG. 1, reference letter $I_0$ denozes an anode current, $I_1$ represents a turn-off current of the thyristor GTO, $I_2$ represents a turn-on current of the thyristor GTO, and $I_3$ represents a current for storing energy which will be hereinafter referred to as the energy storing current.

FIG. 2 illustrates time-variations in the current waveforms seen at various circuit points in the circuit shown in FIG. 1. In FIG. 2, reference symbols $I_1$, $I_2$, $I_3$ and $I_0$ represent currents corresponding to those indicated by the same symbols in FIG. 1.

The circuit shown in FIG. 1 is operated in a manner described below. At first, when the transistor T1 is turned on with the thyristor GTO being in the non-conducting state, no turn-off current $I_1$ flows. On the other hand, an energy storing current $I_3$ flows through a path extending from the d.c. power source Eg through the transistor T1, the inductor L1 and the resistor R1 back to the d.c. power source Eg. Hereinafter, such current path is expressed simply as Eg - T1 - L1 - R1 - Eg for the convenience' sake of description. In this state, when the transistor T1 is turned off, a voltage is induced in the inductor L7 with the polarity shown in FIG. 1, as the result of which a turn-on current $I_2$ flows through a current path of L1 - R1 - GTO -L1 thereby to turn on the thyristor GTO. Upon further turning-on of the transistor T1 at a time $T_0$ with the thyristor GTO being in the conducting state, a turn-off current $I_1$ now flows through a path of Eg - T1 - GTO - Eg, while the energy storing current $I_3$ flows through the current path of Eg - T1 - L1 -R1 -Eg. Consequently, the thyristor GTO is turned off at a time point $t_1$ to decrease the anode current $I_0$ to zero, as is shown in FIG. 2. In contrast, the energy storing current $I_3$ will continue to increase until the time point $t_2$ and take a constant value after the time point $t_2$. When the transistor T1 is again turned off at the time point $t_3$ (FIG. 2), then a voltage of the polarity shown in FIG. 1 is again induced across the inductor L1, causing the turn-on current $I_2$ to flow through the current path of L1 - R1 -GTO - L1, whereby the thyristor GTO is again turned on. In a similar manner, control for turning off and on the thyristor GTO can be repeated by turning on and off the transistor T1.

FIG. 3 shows a gate circuit for a GTO thyristor in which the means for storing energy for turning on the thyristor GTO is constituted by a transformer, according to another embodiment. As can be seen from this figure, a d.c. power source Eg is connected between the gate and the cathode side of the thyristor GTO. The positive pole of the d.c. power source Eg is connected to the cathode side of the thyristor GTO, while the negative pole thereof is connected to the gate side of the thyristor GTO through a series connection of a diode D1 and a transistor T2. Alternately, the transistor T2 may be inserted in the path connected to the positive pole of the d.c. power source Eg. Connected in parallel to the series connection of the d.c. power source Eg and the transistor T2 is a transformer TR1 which has a primary winding N1 and a secondary winding N2 wound w:t' the identical polarity. One end of the primary winding N1 of the transformer TR1 is connected to a junction between the diode D1 and the transistor T2 through a resistor R2, while the other end of the primary winding N1 is connected to the cathode side of the thyristor GTO. On the other hand, one end of the secondary winding N2 is connected to a junction between the gate of the thyristor GTO and the diode D1 through a transistor T3, while the other end of the secondary winding N2 is connected to the cathode side of the thyristor GTO. The base of the transistor T3 is connected to the cathode side of the thyristor GTO through a resistor R3. It should be noted that the waveforms of currents seen at the various circuit points corresponding to those shown in FIG. 1 substantially correspond to the waveforms shown in FIG. 2.

The circuit shown in FIG. 3 is operated in a manner described below. At first, when the transistor T2 is turned on with the thyristor GTO being in the non-conducting state, no turn-off current $I_1$ flows, while the energy storing current $I_3$ flows through a current path of Eg - N1 - R2 - T2 -Eg. By turning off the transistor T2, an induced current is produced in the secondary winding N2 of the transformer TR1 and flows at first through a current path of N2 - T3 - R3 - N2 to turn on the transistor T3. Subsequently, the induced current flows through a path of N2 - T3 - GTO - N2 as a turn-on current $I_2$, thereby to turn on the thyristor GTO. Thereafter, the transistor T3 is turned off. When the transistor T2 is again turned on, then a turn-off current $I_1$ flows through a current path of Eg - GTO - D1 - T2 - Eg, while an energy storing current $I_3$ flows through the current path of Eg - N1 - R2 - T2 - Eg. As a result, the thyristor GTO is turned off to cut off the anode current to zero. However, the energy storing current $I_3$ continues to flow through the current path described above. When the transistor T2 is again turned off, current is induced in the secondary winding N2 and flows through the current path of N2 - T3 - R3 - N2 to turn on the transistor T3. Subsequently, the induced current flows through the path of N2 - T3 - GTO - N2 thereby to turn on the thyristor GTO. In a similar manner, control to turn off and on GTO can be repeated by turning on and off the transistor.

The circuit arrangement shown in FIG. 3 enjoys an advantage that a large current can be derived from the secondary winding N2 of the transformer TR1 even when the current flowing through the primary winding is relatively small. The maximum value $i_2$ of the current induced in the secondary winding N2 after an interruption of the primary current flowing through the primary winding N1 may be given by the following expression:

$$i_2 = i_1 \cdot (n_1/n_2)$$

where $i_1$ represents the value of the primary current immediately before the interruption thereof, and $n_1$ and $n_2$ represent the numbers of turns of the primary and the secondary windings N1 and N2, respectively. By selecting such that $n_1 > n_2$, the current flowing through the primary winding N1 may be of a small magnitude, whereby loss due to the resistor R2 can be correspondingly reduced.

FIG. 4 shows a gate circuit for a GTO thyristor according to another embodiment of the invention in which a transformer is used as the turn-on energy storing means and which differs from the circuit shown in FIG. 3 in that an additional transistor is provided in place of a diode. As can be seen from the figure, a d.c. power source Eg is connected between the gate and the cathode of a GTO thyristor GTO. The positive pole of the d.c. power source Eg is connected to the cathode side of the thyristor GTO, while the negative pole thereof is connected to the gate side of the thyristor GTO through a transistor T2'. A transformer TR1 having a primary winding N1 and a secondary winding N2 wound with the same polarity is connected in parallel with the d.c. power source Eg. One end of the primary winding N1 of the transformer TR1 is connected to a junction between the d.c. power source Eg and the transistor T2' through a series connection of a resistor R2 and a transistor T4, while the other end of the primary winding N1 is connected to the cathode side of the thyristor GTO. On the other hand, one end of the secondary winding N2 is connected to a junction between the gate of the thyristor GTO and the transistor T2' through a transistor T3, while the other end of the secondary winding N2 is connected to the cathode side of the thyristor GTO. The base of the transistor T3 is connected to the cathode side of the thyristor GTO through a resistor R3.

FIG. 5 illustrates time-variations in the current waveforms seen at various circuit points in the circuit shown in FIG. 4. The turn-on current $I_1'$, turn-off current $I_2'$, energy storing current $I_3'$ and the anode current $I_0'$ shown in FIG. 5 correspond to those currents denoted by the same reference symbols in FIG. 4.

The circuit shown in FIG. 4 is operated in a manner described below. At first, the transistor T4 is turned on with the transistors T2', T3 and the thyristor GTO being in the non-conducting or off state. In response thereto, an energy storing current $I_3'$ flows through a current path of Eg - N1 - R2 - T4 - Eg. When the transistor T4 is subsequently turned off, an induced current is produced in the secondary winding N2 which flows in the first place through a current path of N2 - T3 - R3 - N2 thereby to turn on the transistor T3. Successively, the induced current flows through a current path of N2 - T3 - GTO - N2 as a turn-on current $I_2$ to turn on the thyristor GTO. Thereafter, the transistor T3 is turned off. Next, upon turning on of the transistor T2' at a time $t_0$ shown in FIG. 5, a turn-off current $I_1'$ flows through a current path of Eg - GTO - T2' - Eg, whereby the thyristor GTO is turned off to cut off the anode current $I_0$ to zero at the time point $t_1$. At this time $t_1$, the transistor T2' is turned off. Since the transistor T4 is in the off-state at this time $t_1$, any energy storing current $I_3'$ does not flow. When the transistor T4 is turned on at a time point $t_2$ shown in FIG. 5, the energy storing current $I_3'$ is allowed to flow again through the current path of Eg - N1 - R2 - T4 - Eg. When the transistor T4 is then turned off at a time point $T_3$, the turn-on current $I_2'$ flows through the current path of N2 - T3 - GTO - N2 through the similar process described hereinbefore, thereby to turn on the thyristor GTO. In this way, the turning-on and turning-off of the thyristor GTO are controlled through the turning-on and off operation of the transistors T2' and T4.

In the case of the circuit arrangement shown in FIG. 4, the time points at which the transistors T2 and T4 are turned on and off are so adjusted that no current flows during the time period between $t_1$ and $t_2$ shown in FIG. 5, the wasteful current consumption and hence the circuit loss can be reduced to an extremely small level.

FIG. 6 shows a gate circuit for a GTO thyristor in which a transformer is used as the turn-on energy storing means, according to another embodiment. In the case of this gate circuit, a GTO thyristor and the d.c. power source Eg are electromagnetically coupled to each other through a transformer TR2, as can be seen from the figure. One end of the primary winding N10 of the transformer TR2 is connected to a negative pole of the d.c. power source Eg through a series connection of a resistor R5 and a transistor T5, while the other end of the primary winding N10 is connected to the positive pole of the d.c. power source Eg. On the other hand, one end of the secondary winding N20 of the transformer TR2 is connected to the gate of the thyristor GTO through a parallel connection of a diode D2 and a resistor R4. The other end of the secondary winding N20 is connected to the cathode of the thyristor GTO.

FIG. 7 shows an equivalent circuit of the circuit arrangement shown in FIG. 6. As can be seen from a comparison with the circuit shown in FIG. 1, the equivalent circuit shown in FIG. 7 bears a close resemblance to the circuit shown in FIG. 1. In the following, description will be made on the operation of the circuit shown in FIG. 6 with the aid of the equivalent circuit shown in FIG. 7, in which Ll1 and Ll2 represent leakage inductances on the primary and the secondary sides, respectively, of the transformer TR2, Lex represents an excitation inductance, and $I_{ex}$ represents an excitation current. At first, when the transistor T5 is turned on with the thyristor GTO being in the non-conducting state, no turn-off current flows, while an excitation current $I_{ex}$ flows through a current path of Eg - Lex - Ll1 - T5 - R5 - Eg. By turning off the transistor T5 at this time, a voltage is produced across the excitation inductance Lex with the polarity shown in FIG. 7, as a result of which a turn-on current flows through a current path of Lex - Ll2 - R4 - GTO - Lex, thereby to turn on the thyristor GTO. Subsequently, by turning on the transistor T5 again, a turn-off current flows through a current path of Eg - GTO - D2 - Ll2 - Ll1 - T5 - R5 - Eg, while at the same time the excitation current $I_{ex}$ flows through the current path of Eg - Lex - Ll1 - T5 - R5 - Eg. Consequently, the thyristor GTO is turned off to reduce the anode current to zero. However, the excitation current $I_{ex}$ continues to flow. By turning off again the transistor T5, a voltage is again induced across the excitation inductance LEx with the polarity shown in FIG. 7, resulting in a flow of the turn-on current through the current path of Lex - Ll2 - R4 - GTO - Lex thereby to turn on the thyristor GTO again. In this way, the control for turning off and on the thyristor GTO can be repeated by turning on and off the transistor T5. It will be appreciated that the excitation current $I_{ex}$ corresponds to the energy storing current $I_3$ described hereinbefore.

The circuit arrangement illustrated in FIG. 6 and described above with reference to FIG. 7 brings about advantages such that insulation between the thyristor GTO and the d.c. power source Eg can be assured by the presence of the transformer TR2 and that a number of GTo thyristors can be simultaneously supplied with gate currents by providing a corresponding number of the secondary windings for the transformer TR2.

We claim:

1. A gate circuit for a gate turn-off thyristor having a cathode, an anode, and a gate, comprising:
    a series connection of a d.c. power supply source and a first switching element, said series connection being inserted between the cathode and the gate of said gate turn-off thyristor through a diode, the positive pole of said d.c. power supply source being connected to the cathode of said gate turn-off thyristor, while the negative pole of said d.c. power supply source is connected to the gate of said gate turn-off thyristor through said first switching element and said diode; and
    a transformer having a primary winding and a secondary winding both wound with the same polarity, one end of said primary winding being connected to the cathode of said diode through a resistor while the other end of said primary winding is connected to the cathode of said gate turn-off thyristor, and one end of said secondary winding being connected to the anode of said diode through a second switching element while the other end of said secondary winding is connected to the cathode of said gate turn-off thyristor.

2. A gate circuit for a gate turn-off thyristor as set forth in claim 1, wherein said second switching element is constituted by a transistor having its collector connected to the anode of said diode, its emitter connected to said one end of said secondary winding of said transformer and its base connected to said other end of said secondary winding of said transformer.

3. A gate circuit for a gate turn-off thyristor having a cathode, an anode, and a gate, comprising:
    a d.c. power supply source inserted between the cathode and the gate of said gate turn-off thyristor through a first switching element, the positive pole of said d.c. power supply source being connected to the cathode of said gate turn-off thyristor, while the negative pole of said d.c. power supply source is connected to the gate of said gate turn-off thyristor through said first switching element; and
    a transformer having a primary winding and a secondary winding both wound with the same polarity, one end of said primary winding being connected to the negative pole of said d.c. power supply source through a second switching element while the other end of said primary winding is connected to the positive pole of said d.c. power supply source, and one end of said secondary winding being connected to the gate of said gate turn-off thyristor through a third switching element while the other end of said secondary windig is connected to the cathode of said gate turn-off transistor.

4. A gate circuit for a gate turn-off thyristor as set forth in claim 3, wherein said third switching element is constituted by a transistor having its collector connected to the gate of said gate turn-off thyristor, its emitter connected to said one end of the secondary winding of said transformer and its base connected to said other end of the secondary winding of said transformer.

* * * * *